US012696578B2

(12) United States Patent
Zhao et al.

(10) Patent No.: US 12,696,578 B2
(45) Date of Patent: Jul. 28, 2026

(54) BACK-CONTACT SOLAR CELL, SOLAR CELL STRUCTURE, AND PHOTOVOLTAIC MODULE

(71) Applicant: LONGI SOLAR TECHNOLOGY (TAIZHOU) CO., LTD., Taizhou (CN)

(72) Inventors: Debao Zhao, Taizhou (CN); Peng Chen, Taizhou (CN); Jun Chen, Taizhou (CN); Hua Li, Taizhou (CN)

(73) Assignee: LONGi Solar Technology (Taizhou) Co., Ltd., Taizhou (CN)

( * ) Notice: Subject to any disclaimer, the term of this patent is extended or adjusted under 35 U.S.C. 154(b) by 0 days.

(21) Appl. No.: 18/826,427

(22) Filed: Sep. 6, 2024

(65) Prior Publication Data

US 2024/0429325 A1 Dec. 26, 2024

Related U.S. Application Data

(63) Continuation-in-part of application No. PCT/CN2023/123779, filed on Oct. 10, 2023.

(30) Foreign Application Priority Data

Nov. 7, 2022 (CN) .......................... 202222957031.9

(51) Int. Cl.
*H10F 77/00* (2025.01)
*H10F 19/90* (2025.01)
*H10F 77/20* (2025.01)

(52) U.S. Cl.
CPC ......... *H10F 77/937* (2025.01); *H10F 19/908* (2025.01); *H10F 77/219* (2025.01)

(58) Field of Classification Search
CPC .... H10F 77/937; H10F 19/908; H10F 77/219; H10F 10/146
See application file for complete search history.

(56) References Cited

U.S. PATENT DOCUMENTS

2008/0216887 A1* 9/2008 Hacke ................... H10F 77/219
257/E31.11
2010/0024881 A1 2/2010 Hacke et al.
(Continued)

FOREIGN PATENT DOCUMENTS

CN 106981544 A 7/2017
CN 111628028 A 9/2020
(Continued)

OTHER PUBLICATIONS

English translation, JP 2006-120944 A (Year: 2025).*
(Continued)

*Primary Examiner* — Angelo Trivisonno
(74) *Attorney, Agent, or Firm* — Fish & Richardson P.C.

(57) ABSTRACT

This application discloses a back-contact solar cell, a solar cell structure, and a photovoltaic module. In one aspect, a back-contact solar cell includes a solar cell body, a positive electrode and a negative electrode formed on a back surface of the solar cell body. The positive electrode and the negative electrode each include a plurality of fingers, a plurality of busbars, and a connection electrode. At least one finger of the positive electrode and at least one finger of the negative electrode are continuous. Each busbar includes busbar sections distributed at intervals along a second direction. Each busbar section is separated from fingers having a polarity opposite to that of the busbar section by gaps between the busbar sections. Each connection electrode is connected to fingers having the same polarity as that of the connection electrode and insulated from fingers having a polarity opposite to that of the connection electrode.

14 Claims, 5 Drawing Sheets

(56)                References Cited

U.S. PATENT DOCUMENTS

2015/0068592 A1 *   3/2015  Kommera ............. H10F 10/146
                                              136/256
2017/0069776 A1     3/2017  Yang et al.

FOREIGN PATENT DOCUMENTS

| | | | |
|---|---|---|---|
| CN | 214313221 U | 9/2021 | |
| CN | 219163409 U | 6/2023 | |
| DE | 102008033189 A1 | 11/2009 | |
| JP | 2006120944 A * | 5/2006 | .......... H10F 77/219 |
| WO | 2021/083943 A1 | 5/2021 | |

OTHER PUBLICATIONS

Extended European Search Report in European Appln No. 23887706.
2, dated Apr. 16, 2025, 8 pages.
International Preliminary Report on Patentability in International
Appln. No. PCT/CN2023/123779, mailed on May 15, 2025, 11
pages (with English translation).
International Search Report and Written Opinion in International
Appin. No. PCT/CN2023/123779, mailed on Nov. 24, 2023, 13
pages (with English translation).
Office Action in European Appln. No. 23887706.2, dated May 8,
2025, 1 page.
Office Action in Australian Appln. No. 2023379251, mailed on Aug.
22, 2025, 3 pages.
Office Action in Japanese Appln. No. 2025-509200, mailed on Sep.
3, 2025, 10 pages (with English translation).

* cited by examiner (1)                                (2)

BACK-CONTACT SOLAR CELL, SOLAR CELL STRUCTURE, AND PHOTOVOLTAIC MODULE

CROSS-REFERENCE TO RELATED APPLICATIONS

This application is a continuation-in-part of International Application No. PCT/CN2023/123779, filed on Oct. 10, 2023, which claims priority to Chinese Patent Application No. 202222957031.9, filed on Nov. 7, 2022. The disclosures of the aforementioned applications are hereby incorporated by reference in their entireties.

TECHNICAL FIELD

This application relates to the field of solar cell technologies, and in particular, to a back-contact solar cell, a solar cell structure, and a photovoltaic module.

BACKGROUND

A back-contact solar cell is a solar cell in which emitters and metal contacts are arranged on its back surface and no metal electrode is arranged on its front surface. Compared with a solar cell with a metal contact arranged on its front surface, the back-contact solar cell has a higher short-circuit current and photoelectric conversion efficiency, and is one of existing technical directions for realizing efficient crystalline silicon solar cells.

However, current mismatch exists between different busbars in a positive electrode and different busbars in a negative electrode included in an existing back-contact solar cell, which is not conducive to improving the electrical performance of the back-contact solar cell.

SUMMARY

An objective of this application is to provide a back-contact solar cell, a solar cell structure, and a photovoltaic module, to suppress current mismatch existing between different busbars in a positive electrode and different busbars in a negative electrode included in the back-contact solar cell, which is conducive to improving the electrical performance of the back-contact solar cell.

According to a first aspect, this application provides a back-contact solar cell. The back-contact solar cell includes: a solar cell body, and positive electrodes and negative electrodes formed on a back surface of the solar cell body. The positive electrodes and the negative electrodes each include a plurality of fingers, a plurality of busbars, and at least one connection electrode.

The fingers included in each positive electrode and the fingers included in each negative electrode all extend along a first direction and are alternately spaced along a second direction, where the first direction is different from the second direction. At least one finger included in each positive electrode and at least one finger included in each negative electrode are continuous fingers. The busbars included in each positive electrode and the busbars included in each negative electrode all extend along the second direction and are alternately spaced along the first direction. Each busbar is connected to a finger having the same polarity as that of the busbar, each busbar includes a plurality of busbar sections distributed at intervals along the second direction, and a gap between every two adjacent busbar sections in the same busbar is used for separating each of the busbar sections from each finger having a polarity opposite to that of the busbar sections. Each connection electrode is located on an outer side of all the busbars included in the positive electrodes and the negative electrodes along the first direction. Each connection electrode is connected to all fingers having the same polarity as that of the connection electrode and is insulated from all fingers having a polarity opposite to that of the connection electrode.

In a case that the foregoing technical solution is used, in the back-contact solar cell provided in this application, each busbar includes a plurality of busbar sections distributed at intervals along the second direction, and the gap between every two adjacent busbar sections in the same busbar is used for separating each of the busbar sections from each finger having a polarity opposite to that of the busbar sections. In this case, there is no need to arrange an insulating material between each busbar and a finger having a polarity opposite to that of the busbar, and short circuit can also be prevented, thereby reducing a use amount of the insulating material and reducing manufacturing costs of the back-contact solar cell.

In addition, different busbar sections included in each busbar are connected to corresponding fingers having the same polarity as that of the busbar sections, to converge carriers collected at corresponding positions of the fingers. In addition, in a case that at least one finger included in each positive electrode is a continuous finger, the continuous finger included in the positive electrode can connect corresponding busbar sections belonging to different busbars in the positive electrode together, so that currents of the different busbar sections connected together through the continuous finger are the same. Besides, the connection electrode included in each positive electrode is connected to all the fingers included in the positive electrode, and different busbar sections connected to the fingers included in the positive electrode are further connected together by connecting the fingers included in the positive electrode together, thereby helping connect all busbar sections belonging to the same busbar together through the connection electrode while suppressing current mismatch between different busbars included in the positive electrode. In this way, a case that some busbar sections included in a busbar fail to be connected to a conductive wire connecting adjacent solar cells caused by offset of the conductive wire connecting adjacent solar cells soldered to the busbar included in the positive electrode is prevented, so that the carriers converged by each busbar section included in the busbar can be led out through the conductive wire connecting adjacent solar cells, which is further conducive to improving the photoelectric conversion efficiency of the back-contact solar cell. Similarly, the negative electrode in this application also has the beneficial effects of the positive electrode described above, and details are not described herein again.

In a possible implementation, a gap between every two adjacent busbar sections in the same busbar along the second direction ranges from 0.4 mm to 2 mm. In this case, the gap between every two adjacent busbar sections in the same busbar along the second direction has a moderate size, so that short circuit caused by connection between a busbar section and a finger having a polarity opposite to that of the busbar section due to a small gap can be prevented, thereby ensuring that each busbar section can be separated from a finger having a polarity opposite to that of the busbar section through the gap. In addition, a case that a length of each busbar section along the second direction is small caused by a large gap and the length further affects convergence of the busbar section for carriers generated at a corresponding position of the solar cell body after photons are absorbed can also be prevented, thereby ensuring that each busbar section has a high carrier converging capability and further improving the electrical performance of the back-contact solar cell.

In a possible implementation, each connection electrode is located at end portions of all the fingers included in the positive electrodes and the negative electrodes along the first direction. In this case, each connection electrode may be located at an edge position of the solar cell body along the first direction, which is conducive to increasing a distance between the connection electrode and a busbar having a polarity opposite to that of the connection electrode and preventing short circuit.

In a possible implementation, heads and tails of all the fingers included in the positive electrodes and the negative electrodes along the first direction are flush with each other. In this case, along the first direction, all the fingers included in the positive electrodes and the negative electrodes can be regularly distributed on the back surface of the solar cell body, so that carriers generated by parts of the solar cell body along the first direction after photons are absorbed can be effectively collected by each of the fingers, which is further conducive to improving the electrical performance of the back-contact solar cell.

In a possible implementation, the at least one connection electrode included in each positive electrode is located on a first outer side of all the busbars included in the positive electrodes and the negative electrodes along the first direction; the at least one connection electrode included in the negative electrode is located on a second outer side of all the busbars included in the positive electrodes and the negative electrodes along the first direction; and the second outer side is arranged opposite to the first outer side.

In a case that the foregoing technical solution is used, the at least one connection electrode included in each positive electrode is located on the same first outer side of all the busbars included in the back-contact solar cell along the first direction; and the at least one connection electrode included in the negative electrode is located on the same second outer side of all the busbars included in the back-contact solar cell along the first direction. In addition, the first outer side is arranged opposite to the second outer side, so that short circuit caused by different connection electrodes having opposite polarities located on the same outer side can be prevented, thereby ensuring stable electrical performance of the back-contact solar cell.

In a possible implementation, each finger is spaced apart from a connection electrode having a polarity opposite to that of the finger by a gap extending along the first direction. In this case, each finger may be separated from the connection electrode having a polarity opposite to that of the finger through the gap extending along the first direction, so that there is no need to arrange an insulating material between the finger and the connection electrode having a polarity opposite to that of the finger, and short circuit can also be prevented, thereby further reducing a use amount of the insulating material and reducing manufacturing costs of the back-contact solar cell.

In a possible implementation, the plurality of busbar sections included in the same busbar are distributed at equal intervals along the second direction. In this case, the plurality of busbars respectively included in the positive electrodes and the negative electrodes can be uniformly distributed on the back surface of the solar cell body, and distances between parts of the solar cell body along a direction parallel to the back surface and corresponding busbars are substantially the same, so that carriers generated by the parts of the solar cell body after photons are absorbed can be collected by corresponding fingers in time and converged to the corresponding busbars in time, thereby reducing a carrier recombination rate and further improving the photoelectric conversion efficiency of the back-contact solar cell.

In a possible implementation, different busbar sections included in the same busbar have the same length, and length directions of the busbar sections are parallel to the second direction. For beneficial effects in this case, reference may be made to the analysis of the beneficial effects that the plurality of busbar sections included in the same busbar are distributed at equal intervals along the second direction above, and details are not described herein again.

In a possible implementation, different busbars having the same polarity include the same quantity of busbar sections. For beneficial effects in this case, reference may be made to the analysis of the beneficial effects that the plurality of busbar sections included in the same busbar are distributed at equal intervals along the second direction above, and details are not described herein again.

In a possible implementation, heads and tails of busbar sections corresponding to the same section number in different busbars having the same polarity are flush with each other along the same direction; and busbar sections corresponding to different section numbers in the same busbar are distributed at intervals along the second direction.

In a case that the foregoing technical solution is used, the heads and tails of the busbar sections corresponding to the same section number in the different busbars having the same polarity are flush with each other along the same direction, so that gaps corresponding to the same section number in the different busbars having the same polarity extend along the direction, so that the finger may be a linear finger extending along a single straight-line direction, which is conducive to simplifying a structure of each of the fingers included in the positive electrodes and the negative electrodes.

In a possible implementation, heads and tails of busbar sections corresponding to the same section number in different busbars having opposite polarities are staggered along the second direction; and busbar sections corresponding to different section numbers in the same busbar are distributed at intervals along the second direction.

In a case that the foregoing technical solution is used, heights of the busbar sections corresponding to the same section number in the different busbars having opposite polarities along the second direction are different. Based on this, when other factors are the same, the heads and tails of the busbar sections corresponding to the same section number in the different busbars having opposite polarities along the second direction are staggered, so that a gap between every two adjacent busbar sections included in the same busbar can be increased, and short circuit caused by connection between each busbar section and a finger having a polarity opposite to that of the busbar section can be further prevented, thereby improving the electrical stability of the back-contact solar cell.

In a possible implementation, the back-contact solar cell further includes soldering portions, and each of the soldering portions is connected to a corresponding busbar.

In a possible implementation, among all the soldering portions included in the back-contact solar cell, at least a subset of soldering portions located between every two adjacent busbar sections included in the same busbar are first-type soldering portions, and the remaining soldering portions are second-type soldering portions; among all the fingers included in the positive electrodes and the negative electrodes, at least a subset of fingers located at the same height as the first-type soldering portions along the second direction are first-type fingers, and the remaining fingers are second-type fingers; and each busbar and a soldering portion arranged on the busbar have the same polarity; and each of the first-type fingers includes a plurality of finger sections distributed at intervals along the first direction, and a gap between every two adjacent finger sections included in the same first-type finger is used for separating each of the first-type finger sections from a first-type soldering portion having a polarity opposite to that of the first-type finger sections. In this case, there is no need to arrange an insulating material between each first-type finger and a soldering portion having a polarity opposite to that of the first-type finger, and short circuit can also be prevented, thereby reducing a use amount of the insulating material and reducing manufacturing costs of the back-contact solar cell.

According to a second aspect, this application further provides a solar cell structure. The solar cell structure includes an insulating material and the back-contact solar cell according to the first aspect and various implementations of the first aspect. The insulating material at least covers a gap between every two adjacent busbar sections included in each busbar.

In a possible implementation, along the first direction, a width of the insulating material is greater than a width of each busbar and less than a preset width; and the preset width ranges from 1.5 mm to 10 mm. In this case, a width of the insulating material along the first direction has a moderate size, so that an increase in a use amount of the insulating material caused by a large width of the insulating material can be prevented, which is conducive to controlling manufacturing costs of the back-contact solar cell. In addition, a strict requirement on a placement position of a conductive wire connecting adjacent solar cells when different back-contact solar cells are connected together caused by a small width of the insulating material can also be prevented, which is conducive to decreasing the soldering difficulty in connecting at least two back-contact solar cells together.

In a possible implementation, in a case that the back-contact solar cell includes soldering portions and each of the soldering portions is connected to a corresponding busbar, the solar cell structure further includes a conductive adhesive. The conductive adhesive is arranged on at least one soldering portion.

In a case that the foregoing technical solution is used, within a specific range, a greater thickness of the insulating material indicates a better insulating effect of the insulating material. When the thickness of the insulating material is relatively great, a height of a top of the insulating material may be greater than a height of a top of the soldering portion. Based on this, the conductive adhesive is arranged on each soldering portion, so that a height of a top of a structure formed by the conductive adhesive and the soldering portion is greater than or equal to the height of the top of the insulating material, thereby ensuring that the conductive wire connecting adjacent solar cells can be connected to a corresponding soldering portion.

According to a third aspect, this application further provides a photovoltaic module. The photovoltaic module includes the back-contact solar cell according to the first aspect and various implementations of the first aspect, or the solar cell structure according to the second aspect and various implementations of the second aspect.

For beneficial effects of the second aspect and various implementations of the second aspect and the third aspect and various implementations of the third aspect in this application, reference may be made to the analysis of the beneficial effects of the first aspect and various implementations of the first aspect, and details are not described herein again.

The foregoing description is merely an overview of the technical solutions of this application. To understand the technical means of this application more clearly, implementation can be performed according to content of the specification. Moreover, to make the foregoing and other objectives, features, and advantages of this application more comprehensible, specific implementations of this application are particularly listed below.

BRIEF DESCRIPTION OF THE DRAWINGS

To describe the technical solutions in the embodiments of this application or the related art more clearly, the accompanying drawings required for describing the embodiments or the related art are briefly described below. Apparently, the accompanying drawings in the following description show merely some embodiments of this application, and a person of ordinary skill in the art may obtain other accompanying drawings according to the accompanying drawings without creative efforts.

FIG. 6(2) is an enlarged view of a position relationship between fingers and busbars when busbar sections corresponding to the same section number in different busbars having opposite polarities are staggered along the second direction according to an embodiment of this application;

Figure 1:
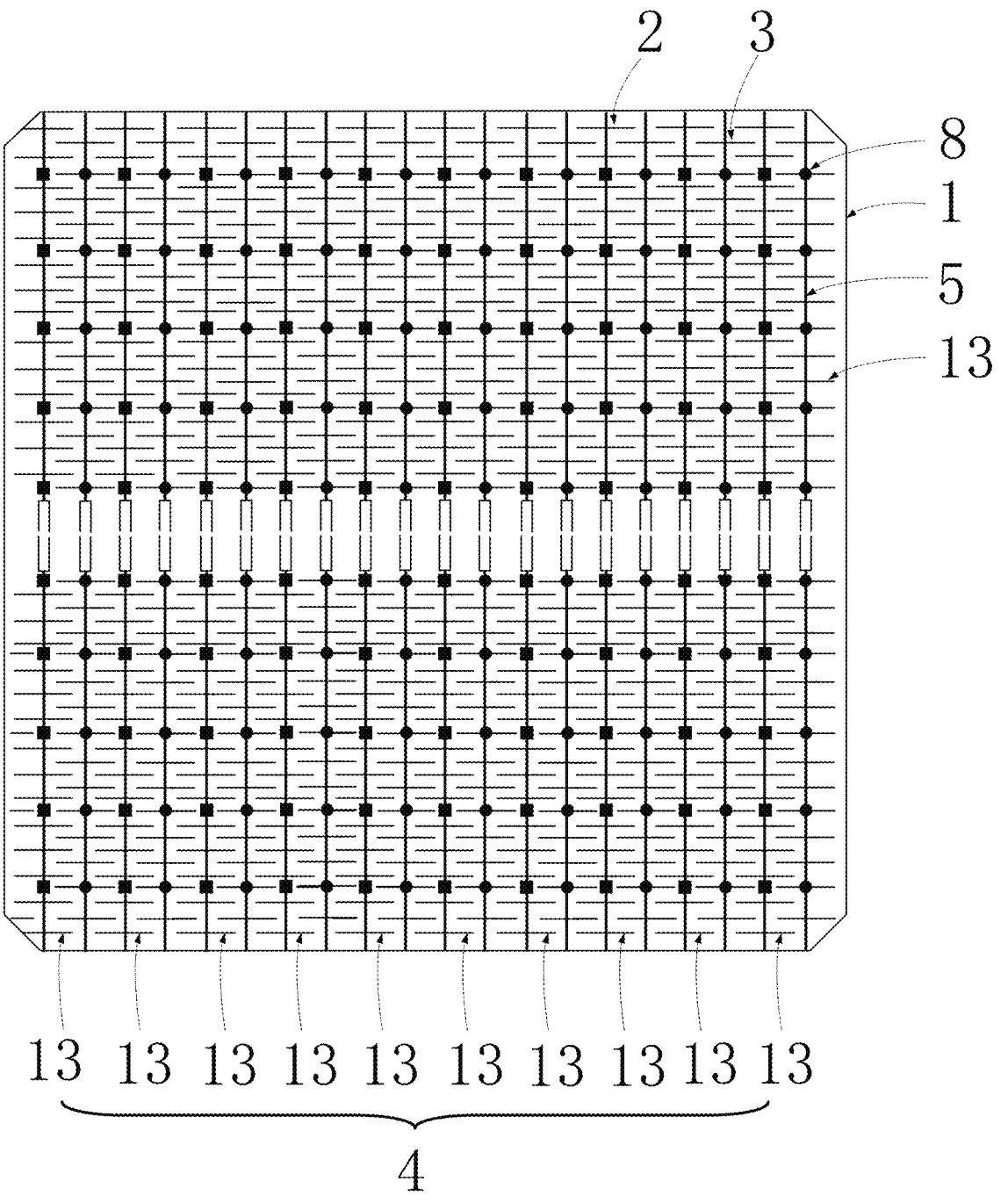
FIG. 1 is a schematic structural diagram of positive electrodes and negative electrodes in an existing back-contact solar cell.

List of reference numerals: 1—Solar cell body, 2—Positive electrode, 3—Negative electrode, 4—Finger, 5—Busbar, 6—Connection electrode, 7—Busbar section, 8—Soldering portion, 9—First-type soldering portion, 10—Second-type soldering portion, 11—First-type finger, 12—Second-type finger, 13—Finger section, 14—Insulating material, and 15—Conductive adhesive.

DETAILED DESCRIPTION

To make the objectives, technical solutions, and advantages of the embodiments of this application clearer, the following clearly and completely describes the technical solutions in the embodiments of this application with reference to the accompanying drawings in the embodiments of this application. Apparently, the described embodiments are merely some embodiments rather than all of the embodiments of this application. Based on the embodiments in this application, all other embodiments obtained by a person of ordinary skill in the art without making creative efforts fall within the protection scope of this application.

To make the technical problems to be resolved by, the technical solutions, and the beneficial effects of this application clearer and more comprehensible, the following further describes this application in detail with reference to the accompanying drawings and embodiments. It should be understood that, the specific embodiments described herein are merely used for describing this application and are not used for limiting this application.

It should be noted that, when an element is described as being "fixed on" or "disposed on" another element, the element may be directly located on the another element or indirectly located on the another element. When an element is described as being "connected to" another element, the element may be directly connected to the another element or indirectly connected to the another element.

In addition, the terms "first" and "second" are used merely for the purpose of description, and shall not be construed as indicating or implying relative importance or implying a quantity of indicated technical features. Therefore, a feature defined by "first" or "second" may explicitly indicate or implicitly include one or more features. In the description of this application, "a plurality of" means two or more, unless otherwise definitely and specifically limited. "Several" means one or more, unless otherwise definitely and specifically limited.

In the description of this application, it should be understood that orientation or position relationships indicated by the terms such as "on", "below", "front", "rear", "left", "right", and the like are based on orientation or position relationships shown in the accompanying drawings, and are used only for case and brevity of illustration of this application and description, rather than indicating or implying that the mentioned apparatus or element must have a particular orientation or must be constructed and operated in a particular orientation. Therefore, such terms should not be construed as a limitation to this application.

In the description of this application, it should be noted that, unless otherwise explicitly specified or defined, the terms such as "mount", "connect", and "connection" should be understood in a broad sense. For example, the connection may be a fixed connection, a detachable connection, or an integral connection; or the connection may be a mechanical connection or an electrical connection; or the connection may be a direct connection, an indirect connection through an intermediary, internal communication between two elements, or an interactive relationship between two elements. A person of ordinary skill in the art can understand specific meanings of the terms in this application based on specific situations.

At present, solar cells are increasingly widely used as a new energy alternative solution. A solar cell is an apparatus converting sun's light energy into electric energy. Specifically, the solar cell generates carriers by using the photovoltaic principle, and leads the carriers out by using electrodes, thereby facilitating the effective use of the electric energy.

When positive electrodes and negative electrodes included in the solar cell are all located on a back surface of the solar cell, the solar cell is a back-contact solar cell. Existing back-contact solar cells include a metal wrap through (MWT) solar cell, an interdigitated back-contact (IBC) solar cell, and the like. A main characteristic of the IBC solar cell is that emitters and metal contacts are all located on a back surface of the solar cell, and a front surface is not blocked by metal electrodes, so that the IBC solar cell has a higher short-circuit current Isc. In addition, the back surface of the IBC solar cell may allow a wider metal grid wire to reduce series resistance Rs, so that a fill factor FF can be improved. In addition, this solar cell without blocking on its front surface is more beautiful in addition to having high photoelectric conversion efficiency. Besides, it is easier to assemble an all-back electrode module, so that the IBC solar cell is one of existing technical directions for realizing efficient crystalline silicon solar cells.

In an actual manufacturing process, as shown in FIG. 1, positive electrodes 2 and negative electrodes 3 included in the IBC solar cell are both formed on a back surface of a solar cell body 1. In addition, the positive electrodes 2 and the negative electrodes 3 each include a plurality of fingers 4 and a plurality of busbars 5. The plurality of fingers 4 included in each positive electrode 2 and the plurality of fingers 4 included in each negative electrode 3 all extend along a first direction and are alternately spaced along a second direction; and the plurality of busbars 5 included in each positive electrode 2 and the plurality of busbars 5 included in each negative electrode 3 all extend along the second direction and are alternately spaced along the first direction. The first direction is different from the second direction. Each finger 4 is connected to a busbar 5 having the same polarity as that of the finger, and each finger 4 includes a plurality of finger sections 13 distributed at intervals along the first direction. A gap between every two adjacent finger sections 13 included in the same finger 4 is used for separating each of the finger sections from each busbar 5 having a polarity opposite to that of the finger sections, to prevent short circuit of the back-contact solar cell caused by connection between the positive electrodes 2 and the negative electrodes 3.

However, as shown in FIG. 1, different finger sections 13 included in the same finger 4 are insulated from each other, and each finger section 13 is configured for collecting carriers generated at a corresponding position of the solar cell body 1. In addition, different busbars 5 included in each positive electrode 2 are connected to different finger sections 13, and correspondingly, different busbars 5 included in each negative electrode 3 are also connected to different finger sections 13. Based on this, when the back-contact solar cell is in a working state, concentrations of carriers generated at different positions of the solar cell body 1 may be different, so that a current collected by each finger section 13 may vary, and currents converged by different busbars 5 connected to different finger sections 13 in each positive electrode 2 may also be different. That is, current mismatch exists between different busbars 5 in each positive electrode 2. Similarly, current mismatch also exists between different busbars 5 in each negative electrode 3, which is not conducive to improving the electrical performance of the back-contact solar cell.

Figures 2, 3:
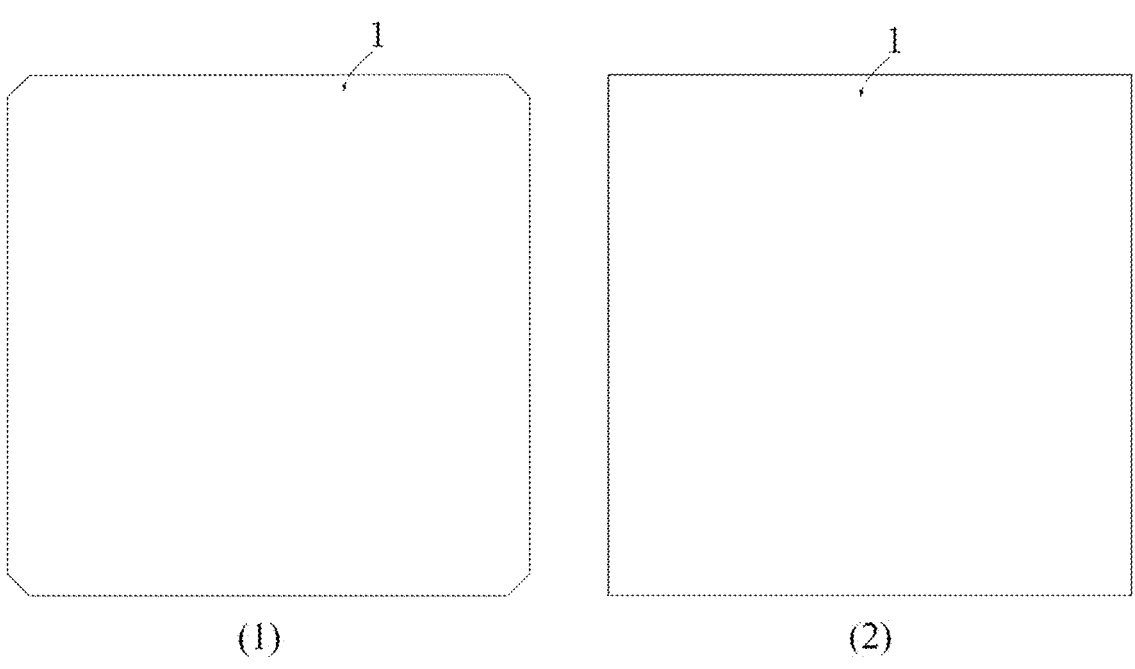
FIG. 2(1) and FIG. 2(2) are schematic diagrams of two structures of a solar cell body according to an embodiment of this application.
FIG. 3 is a schematic diagram of a first structure of a back-contact solar cell according to an embodiment of this application.
Figures 4, 5:
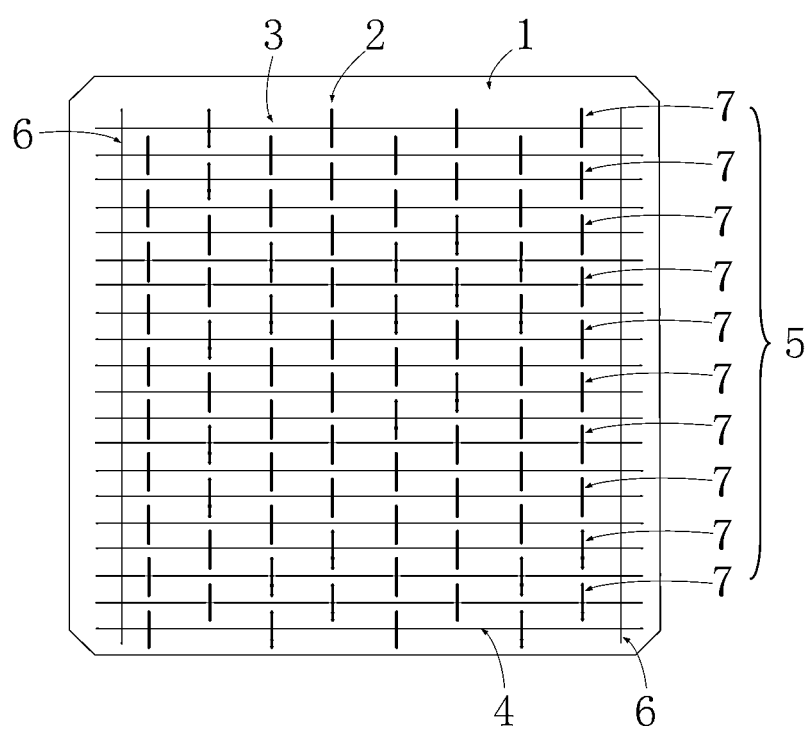
FIG. 4 is a schematic diagram of a second structure of a back-contact solar cell according to an embodiment of this application.
FIG. 5 is a schematic diagram of a third structure of a back-contact solar cell according to an embodiment of this application.

To resolve the foregoing technical problem, according to a first aspect, an embodiment of this application provides a back-contact solar cell. As shown in FIG. 3 to FIG. 5, the back-contact solar cell includes: a solar cell body 1, and positive electrodes 2 and negative electrodes 3 formed on a back surface of the solar cell body 1. The positive electrodes 2 and the negative electrodes 3 each include a plurality of fingers 4, a plurality of busbars 5, and at least one connection electrode 6.

As shown in FIG. 3 to FIG. 5, the fingers 4 included in each positive electrode 2 and the fingers 4 included in each negative electrode 3 all extend along a first direction and are alternately spaced along a second direction. The first direction is different from the second direction. At least one finger 4 included in each positive electrode 2 and at least one finger 4 included in each negative electrode 3 are continuous fingers. The busbars 5 included in each positive electrode 2 and the busbars 5 included in each negative electrode 3 all extend along the second direction and are alternately spaced along the first direction. Each busbar 5 is connected to a finger 4 having the same polarity as that of the busbar, each busbar 5 includes a plurality of busbar sections 7 distributed at intervals along the second direction, and a gap between every two adjacent busbar sections 7 in the same busbar 5 is used for separating each of the busbar sections from each finger 4 having a polarity opposite to that of the busbar sections. Each connection electrode 6 is located on an outer side of all the busbars 5 included in the positive electrodes 2 and the negative electrodes 3 along the first direction. Each connection electrode 6 is connected to all fingers 4 having the same polarity as that of the connection electrode and is insulated from all fingers 4 having a polarity opposite to that of the connection electrode.

To be specific, a specific structure and material of the solar cell body may be set according to an actual application scenario, which are not specifically limited herein. For example, the solar cell body may include a semiconductor substrate, a P-type doped semiconductor layer, and an N-type doped semiconductor layer. A material of the semiconductor substrate may include a semiconductor material such as silicon, silicon germanium, or gallium arsenide. The semiconductor substrate includes a first surface and a second surface opposite to the first surface. The second surface corresponds to the back surface of the solar cell body. The second surface includes a first region and a second region arranged alternately along the first direction along a direction parallel to the second surface. Length extending directions of the first region and second region are both parallel to the second direction. The P-type doped semiconductor layer is formed on or in the first region. The N-type doped semiconductor layer is formed on or in the second region. Doping concentrations of impurities in the P-type doped semiconductor layer and the N-type doped semiconductor layer may be set according to an actual application scenario, provided that the P-type doped semiconductor layer and the N-type doped semiconductor layer can be applied to the back-contact solar cell provided in the embodiments of this application.

In addition, as shown in FIG. 2(1), the solar cell body 1 may be a solar cell body having chamfers. Alternatively, as shown in FIG. 2(2), the solar cell body 1 may alternatively be a solar cell body on which chamfer processing is not performed.

For the positive electrodes and the negative electrodes, as shown in FIG. 3 to FIG. 5, fingers 4 formed on the corresponding P-type doped semiconductor layer are the fingers 4 included in each positive electrode 2, which are configured to collect holes transmitted by the P-type doped semiconductor layer. In addition, busbars 5 connected to the fingers 4 included in each positive electrode 2 are the busbars 5 included in the positive electrode 2. Reversely, fingers 4 formed on the corresponding N-type doped semiconductor layer are the fingers 4 included in each negative electrode 3, which are configured to collect electrons transmitted by the N-type doped semiconductor layer. In addition, busbars 5 connected to the fingers 4 included in each negative electrode 3 are the busbars 5 included in the negative electrode 3.

It may be understood that, a polarity of a finger included in each positive electrode is opposite to a polarity of a finger included in each negative electrode (or a busbar or a connection electrode included in the negative electrode) and is the same as a polarity of another finger included in the positive electrode (or a busbar or a connection electrode included in the positive electrode). Similarly, a polarity of a busbar included in each positive electrode is opposite to a polarity of a finger included in each negative electrode (or a busbar or a connection electrode included in the negative electrode) and is the same as a polarity of another busbar included in the positive electrode (or a finger or a connection electrode included in the positive electrode). A polarity of a connection electrode included in each positive electrode is opposite to a polarity of a finger included in each negative electrode (or a busbar or a connection electrode included in the negative electrode) and is the same as a polarity of another busbar included in the positive electrode (or a finger or another connection electrode included in the positive electrode). Correspondingly, for electrodes whose polarities are respectively the same as or different from those of the finger, the busbar, and the connection electrode included in the negative electrode, reference may be made to the foregoing description, and details are not described herein again.

Figures 6, 7:
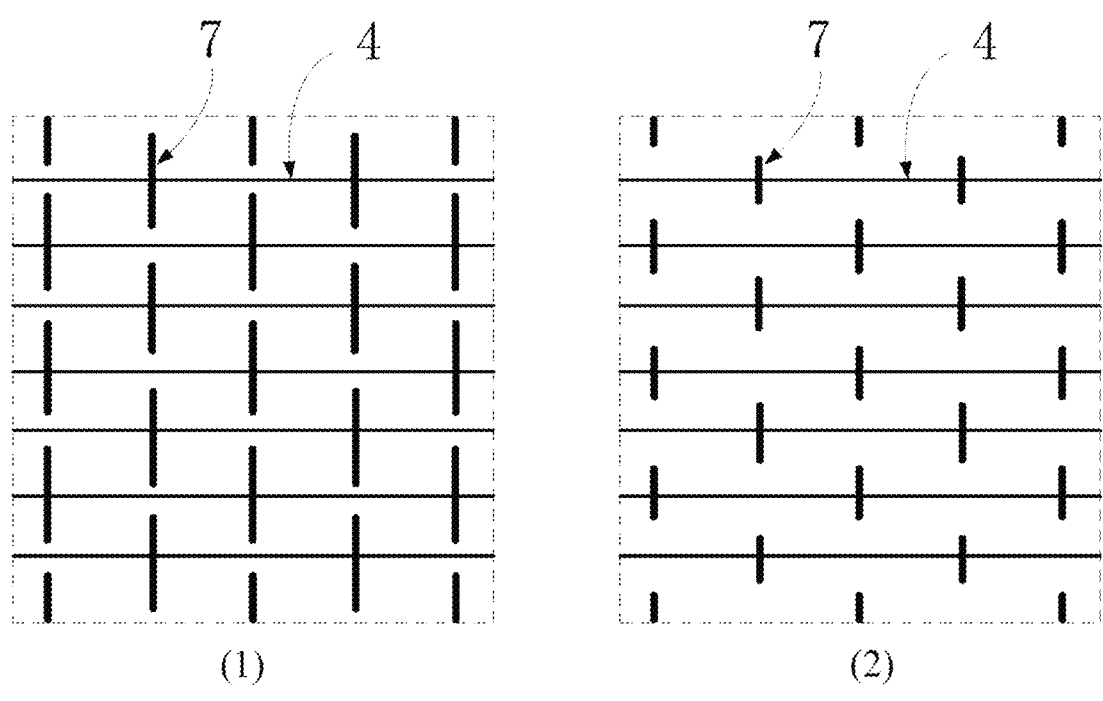
FIG. 6(1) is an enlarged view of a position relationship between fingers and busbars when heights of busbar sections corresponding to the same section number in different busbars having opposite polarities partially overlap with each other along a second direction according to an embodiment of this application.
FIG. 7 is a schematic diagram of a fourth structure of a back-contact solar cell according to an embodiment of this application.
Figure 8:
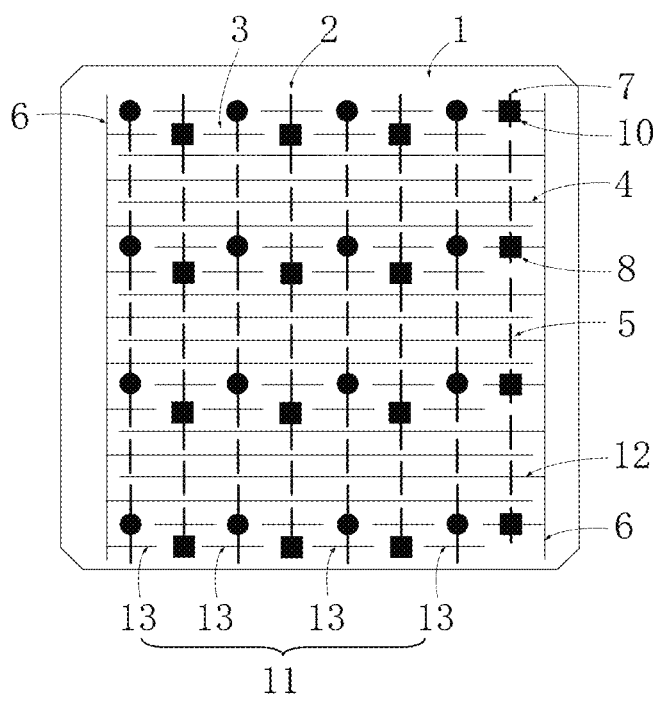
FIG. 8 is a schematic diagram of a fifth structure of a back-contact solar cell according to an embodiment of this application.

In addition, quantities of fingers and sizes of the fingers respectively included in each positive electrode and each negative electrode and a gap between a finger included in a positive electrode and a finger included in a negative electrode adjacent to the positive electrode along the second direction may be set according to an actual application scenario, provided that these settings can be applied to the back-contact solar cell provided in the embodiments of this application. Specifically, the quantities of fingers respectively included in each positive electrode and each negative electrode may be the same or may be different. The gap between a finger included in a positive electrode and a finger included in a negative electrode adjacent to the positive electrode along the second direction may range from 1 mm to 2 mm. Certainly, the gap may alternatively be set to another suitable value according to an actual application scenario requirement. As shown in FIG. 3 to FIG. 5, all the fingers 4 included in the positive electrodes 2 and the negative electrodes 3 may be continuous fingers. A continuous finger is a finger on which no discontinuity exists. For example, a continuous finger is not disrupted by gaps to be segmented into multiple finger sections. Alternatively, as shown in FIG. 7 and FIG. 8, some fingers 4 in the positive electrodes 2 and the negative electrodes 3 are continuous fingers, and the remaining fingers 4 are non-continuous fingers on which a discontinuity exists. In this case, quantities of continuous fingers and non-continuous fingers in each positive electrode 2 and each negative electrode 3, and positions of discontinuities in the non-continuous fingers and quantities of the discontinuities may be set according to an actual application scenario, provided that these settings can be applied to the back-contact solar cell provided in the embodiments of this application.

Besides, quantities of busbars and sizes of the busbars respectively included in each positive electrode and each negative electrode and a gap between a busbar included in a positive electrode and a busbar included in a negative electrode adjacent to the positive electrode along the first direction may be set according to an actual application scenario, provided that these settings can be applied to the back-contact solar cell provided in the embodiments of this application. For example, a total quantity of the busbars included in each positive electrode and each negative electrode may range from 6 to 24. In an actual application, the quantities of busbars included in each positive electrode and busbars included in each negative electrode may be the same or may be different.

Each finger included in the positive electrodes and the negative electrodes may be a straight line-shaped finger, a wavy line-shaped finger, or a curved line-shaped finger, and a specific shape of the finger included in the positive electrodes and the negative electrodes may be set according to an actual application scenario, which is not specifically limited herein. In addition, each busbar included in the positive electrodes and the negative electrodes may be a straight line-shaped busbar, a wavy line-shaped busbar, or a curved line-shaped busbar. A specific shape of the busbar included in the positive electrodes and the negative electrodes may be set according to an actual application scenario, which is not specifically limited herein.

As shown in FIG. 3 to FIG. 5, each busbar 5 includes a plurality of busbar sections 7 distributed at intervals along the second direction. Specifically, a plurality of busbar sections 7 included in the same busbar 5 may be arranged flush with each other along the first direction. Alternatively, at least one pair of busbar sections 7 in the same busbar 5 are spaced along the first direction. In an actual application process, a quantity of pairs of busbar sections 7 spaced along the first direction in the same busbar 5 may be set according to an actual application scenario, provided that the setting can be applied to the back-contact solar cell provided in the embodiments of this application.

In addition, the first direction and the second direction may be any two different directions parallel to the back surface. For example, as shown in FIG. 3 to FIG. 5, in a case that a shape of a cross section of the solar cell body 1 is a rectangle, the first direction may be parallel to a long side of the rectangle, and the second direction may be parallel to a broad side of the rectangle. In this case, the first direction is orthogonal to the second direction.

A gap between every two adjacent busbar sections in the same busbar along the second direction may be set according to an actual requirement, which is not specifically limited herein. For example, the gap between every two adjacent busbar sections in the same busbar along the second direction may range from 0.4 mm to 2 mm. For example, the gap may be 0.4 mm, 0.6 mm, 0.8 mm, 1 mm, 1.2 mm, 1.4 mm, 1.6 mm, 1.8 mm, or 2 mm. In this case, the gap between every two adjacent busbar sections in the same busbar along the second direction has a moderate size, so that short circuit caused by connection between a busbar section and a finger having a polarity opposite to that of the busbar section due to a small gap can be prevented, thereby ensuring that each busbar section can be separated from a finger having a polarity opposite to that of the busbar section through the gap. In addition, a case that a length of each busbar section along the second direction is small caused by a large gap and the length further affects convergence of the busbar section for carriers generated at a corresponding position of the solar cell body after photons are absorbed can also be prevented, thereby ensuring that each busbar section has a high carrier converging capability and further improving the electrical performance of the back-contact solar cell.

For the connection electrode, each connection electrode included in the positive electrodes and the negative electrodes is a continuous connection electrode. A continuous connection electrode is a connection electrode on which no discontinuity exists. In addition, a width of each connection electrode included in the positive electrodes and the negative electrodes is not limited in the embodiments of this application. For example, the width of the connection electrode may be the same as a width of the busbar and may also be the same as a width of the finger. The positive electrodes and the negative electrodes may each include one or more connection electrodes. The quantity of connection electrodes included in each positive electrode may be the same as or different from the quantity of connection electrodes included in each negative electrode. Besides, a specific formation position of each connection electrode on the back surface of the solar cell body may be set according to an actual requirement, provided that each connection electrode is located on an outer side of all the busbars included in the positive electrodes and the negative electrodes along the first direction. As shown in FIG. 3, connection electrodes 6 included in the positive electrodes 2 and connection electrodes 6 included in the negative electrodes 3 may be located on the same outer side of all the busbars 5 along the first direction. In this case, the connection electrode 6 may be insulated from a finger 4 having a polarity opposite to that of the connection electrode through an insulating material. Certainly, the connection electrode and the finger may be insulated from each other through another manner. Alternatively, as shown in FIG. 4 and FIG. 5, the at least one connection electrode 6 included in each positive electrode 2 is located on a first outer side of all the busbars 5 included in the positive electrodes 2 and the negative electrodes 3 along the first direction; the at least one connection electrode 6 included in each negative electrode 3 is located on a second outer side of all the busbars 5 included in the positive electrodes 2 and the negative electrodes 3 along the first direction; and the second outer side is arranged opposite to the first outer side. In this case, short circuit caused by different connection electrodes 6 having opposite polarities located on the same outer side can be prevented, thereby ensuring stable electrical performance of the back-contact solar cell.

In a case that the foregoing technical solution is used, as shown in FIG. 3 to FIG. 5, in the back-contact solar cell provided in the embodiments of this application, each busbar 5 includes a plurality of busbar sections 7 distributed at intervals along the second direction, and the gap between every two adjacent busbar sections 7 in the same busbar 5 is used for separating each of the busbar sections from each finger 4 having a polarity opposite to that of the busbar sections. In this case, there is no need to arrange an insulating material between each busbar 5 and a finger 4 having a polarity opposite to that of the busbar, and short circuit can also be prevented, thereby reducing a use amount of the insulating material and reducing manufacturing costs of the back-contact solar cell. In addition, as shown in FIG. 3 to FIG. 5, different busbar sections 7 included in each busbar 5 are connected to corresponding fingers 4 having the same polarity as that of the busbar sections, to converge carriers collected at corresponding positions of the fingers 4. In addition, in a case that at least one finger 4 included in each positive electrode 2 is a continuous finger, the continuous finger included in the positive electrode 2 can connect corresponding busbar sections 7 belonging to different busbars 5 in the positive electrode 2 together, so that currents of the different busbar sections 7 connected together through the continuous finger are the same. Besides, the connection electrode 6 included in each positive electrode 2 is connected to all the fingers 4 included in the positive electrode 2, and different busbar sections 7 connected to the fingers 4 included in the positive electrode 2 are further connected together by connecting the fingers 4 included in the positive electrode 2 together, thereby helping connect all busbar sections 7 belonging to the same busbar 5 together through the connection electrode 6 while suppressing current mismatch among different busbars 5 included in the positive electrode 2. In this way, a case that some busbar sections 7 included in a busbar 5 fail to be connected to a conductive wire connecting adjacent solar cells caused by offset of the conductive wire connecting adjacent solar cells soldered to the busbar 5 included in the positive electrode 2 is prevented, so that the carriers converged by each busbar section 7 included in the busbar 5 can be led out through the conductive wire connecting adjacent solar cells, which is further conducive to improving the photoelectric conversion efficiency of the back-contact solar cell. Similarly, the negative electrode 3 in the embodiments of this application also has the beneficial effects of the positive electrode 2 described above, and details are not described herein again.

In some cases, each continuous finger is connected to busbars 5 having the same polarity as that of the continuous finger. For example, each continuous finger of the positive electrode 2 is connected to busbars 5 of the positive electrode 2, and each continuous finger of the negative electrode 3 is connected to busbars 5 of the negative electrode 3. As such, besides reducing current mismatch among different busbars 5, the carriers collected by the continuous fingers can be collected and transported by nearby busbars 5, which can shorten the path when transferring the carriers. Therefore, transport resistance can be reduced, and the photoelectric conversion efficiency of the back-contact solar cell can be increased.

In an actual application process, as shown in FIG. 3 and FIG. 4, each connection electrode 6 may be located on all the fingers 4 included in the positive electrodes 2 and the negative electrodes 3. Alternatively, as shown in FIG. 5, each connection electrode 6 may be located at end portions of all the fingers 4 included in the positive electrodes 2 and the negative electrodes 3 along the first direction. In this case, each connection electrode 6 may be located at an edge position of the solar cell body 1 along the first direction, which is conducive to increasing a distance between the connection electrode 6 and a busbar 5 having a polarity opposite to that of the connection electrode and preventing short circuit.

In addition, as shown in FIG. 3 and FIG. 4, heads and tails of all the fingers 4 included in the positive electrodes 2 and the negative electrodes 3 along the first direction may be flush with each other. In this case, along the first direction, all the fingers 4 included in the positive electrodes 2 and the negative electrodes 3 can be regularly distributed on the back surface of the solar cell body, so that carriers generated by parts of the solar cell body 1 along the first direction after photons are absorbed can be effectively collected by each of the fingers 4, which is further conducive to improving the electrical performance of the back-contact solar cell.

Alternatively, an end portion of at least one finger along the first direction is staggered with end portions of the remaining fingers along the first direction. In this case, as shown in FIG. 5, heads and tails of all the fingers 4 included in the positive electrodes 2 may be flush with each other along the first direction, heads and tails of all the fingers 4 included in the negative electrodes 3 may be flush with each other along the first direction, and end portions of all the fingers 4 included in the positive electrodes 2 along the first direction are staggered with end portions of all the fingers 4 included in the negative electrodes 3 along the first direction. In this case, in a case that no insulating material is arranged, each connection electrode 6 is merely connected to fingers 4 having the same polarity as that of the connection electrode and is insulated from fingers 4 having a polarity opposite to that of the connection electrode.

In a possible implementation, each finger is spaced apart from a connection electrode having a polarity opposite to that of the finger by a gap extending along the first direction. As shown in FIG. 5, the gap may be a gap between an end portion of the finger 4 along the first direction with the connection electrode 6 having a polarity opposite to that of the finger. Alternatively, the gap may be a gap arranged on the finger, and the gap is used for dividing the finger into at least two finger sections.

Specifically, a size of the gap may be set according to an actual requirement, which is not specifically limited herein.

In a case that the foregoing technical solution is used, as shown in FIG. 5, each finger 4 may be separated from the connection electrode 6 having a polarity opposite to that of the finger through the gap extending along the first direction, so that there is no need to arrange an insulating material between the finger 4 and the connection electrode 6 having a polarity opposite to that of the finger, and short circuit can also be prevented, thereby further reducing a use amount of the insulating material and reducing manufacturing costs of the back-contact solar cell.

In an actual application process, as described above, each busbar includes a plurality of busbar sections distributed at intervals along the second direction. Specifically, in terms of quantities, quantities of busbar sections included in different busbars having the same polarity may be the same or may be different. For example, as shown in FIG. 3 to FIG. 5, each busbar 5 included in each positive electrode 2 includes 10 busbar sections 7. As shown in FIG. 3 to FIG. 5, when quantities of busbar sections 7 included in different busbars 5 having the same polarity are the same, the plurality of busbars 5 respectively included in the positive electrodes 2 and the negative electrodes 3 can be uniformly distributed on the back surface of the solar cell body 1, and distances between parts of the solar cell body 1 along a direction parallel to the back surface and corresponding busbars 5 are substantially the same, so that carriers generated by the parts of the solar cell body 1 after photons are absorbed can be collected by corresponding fingers 4 in time and converged to the corresponding busbars 5 in time, thereby reducing a carrier recombination rate and further improving the photoelectric conversion efficiency of the back-contact solar cell.

In terms of lengths, lengths of different busbar sections included in the same busbar may be the same or may be different. A length direction of each busbar section is parallel to the second direction. For example, as shown in FIG. 3, a busbar arranged in a first column is a busbar 5 included in a positive electrode 2, and section numbers of different busbar sections 7 included in the busbar 5 are arranged from top to bottom. Lengths of a first busbar section to a tenth busbar section included in the busbar 5 along the second direction are the same.

In addition, lengths of any two busbar sections belonging to different busbars along the second direction may be the same or may be different. When the lengths of any two busbar sections belonging to different busbars are the same, all the busbars in the back-contact solar cell are uniformly distributed on the back surface of the solar cell body, so that carriers generated by the solar cell body after light is absorbed can be led out by the busbars in time, thereby reducing a carrier recombination rate and further improving the electrical performance of the back-contact solar cell.

In terms of distribution, gaps between any two pairs of busbar sections in the same busbar may be the same or may be different. As shown in FIG. 3 to FIG. 5, when gaps between any two pairs of busbar sections 7 in the same busbar 5 are the same, the plurality of busbar sections 7 included in the same busbar 5 are distributed at equal intervals along the second direction. For beneficial effects in this case, reference may be made to the analysis of the beneficial effects when the quantities of busbar sections 7 included in different busbars 5 having the same polarity are the same, and details are not described herein again.

In addition, heads and tails of busbar sections corresponding to the same section number in different busbars having the same polarity may be staggered or may be flush with each other along the same direction; and busbar sections corresponding to different section numbers in the same busbar are distributed at intervals along the second direction. As shown in FIG. 3 to FIG. 5, when the heads and tails of the busbar sections 7 corresponding to the same section number in the different busbars 5 having the same polarity are flush with each other along the same direction, gaps corresponding to the same section number in the different busbars 5 having the same polarity extend along the direction, so that the finger 4 may be a linear finger extending along a single straight-line direction, which is conducive to simplifying a structure of each of the fingers 4 included in the positive electrodes 2 and the negative electrodes 3.

In addition, as shown in FIG. 6(1), heights of busbar sections 7 corresponding to the same section number in different busbars 5 having opposite polarities may partially overlap with each other along the second direction; and busbar sections 7 corresponding to different section numbers in the same busbar 5 are distributed at intervals along the second direction. In this case, when other factors are the same, the heights of the busbar sections 7 corresponding to the same section number in the different busbars 5 having opposite polarities partially overlap with each other along the second direction, so that a length of each busbar section 7 is large, which is conducive to improving a carrier converging capability of the busbar section 7. Alternatively, as shown in FIG. 6(2), heads of tails of the busbar sections 7 corresponding to the same section number in the different busbars 5 having opposite polarities may be staggered along the second direction; and busbar sections 7 corresponding to different section numbers in the same busbar 5 are distributed at intervals along the second direction. In this case, heights of the busbar sections 7 corresponding to the same section number in the different busbars 5 having opposite polarities along the second direction are different. Based on this, when other factors are the same, the heads and tails of the busbar sections 7 corresponding to the same section number in the different busbars 5 having opposite polarities along the second direction are staggered, so that a gap between every two adjacent busbar sections 7 included in the same busbar 5 can be increased, and short circuit caused by connection between each busbar section 7 and a finger 4 having a polarity opposite to that of the busbar section can be further prevented, thereby improving the electrical stability of the back-contact solar cell.

In a possible implementation, as shown in FIG. 7 and FIG. 8, the back-contact solar cell further includes soldering portions 8, and each of the soldering portions 8 is connected to a corresponding busbar 5 to facilitate connection between the busbar 5 and a corresponding conductive wire connecting adjacent solar cells.

Specifically, in terms of quantities, each busbar can be connected to only one soldering portion. Alternatively, as shown in FIG. 7 and FIG. 8, each busbar 5 may be connected to a plurality of soldering portions 8 distributed at intervals along the second direction. Compared with the case that each busbar 5 is connected to only one soldering portion 8, when each busbar 5 is connected to a plurality of soldering portions 8 distributed at intervals along the second direction, problems such as unsoldering of a conductive wire connecting adjacent solar cells due to a poor soldering strength since the conductive wire connecting adjacent solar cells is soldered to only one soldering portion 8 can be prevented, thereby improving the soldering quality of the back-contact solar cell provided in the embodiments of this application during series soldering.

In addition, when each busbar is connected to a plurality of soldering portions distributed at intervals along the second direction, quantities of soldering portions connected to different busbars may be the same or may be different. As shown in FIG. 7 and FIG. 8, when quantities of soldering portions 8 connected to different busbars 5 are the same, the plurality of soldering portions 8 included in the back-contact solar cell can be uniformly distributed on the solar cell body 1, so that an existing series soldering machine can connect a plurality of back-contact solar cells provided in the embodiments of this application in series through a conductive wire connecting adjacent solar cells, thereby improving the soldering efficiency.

In terms of distribution, as shown in FIG. 7 and FIG. 8, a plurality of soldering portions 8 connected to the same busbar 5 may be distributed at equal intervals. In this case, the soldering quality between the conductive wire connecting adjacent solar cells and a corresponding busbar 5 can be improved.

In terms of a morphology, a shape of a cross section of a soldering portion connected to a busbar may be a rectangle, a circle, an ellipse, or the like. A length of the soldering portion along the first direction may be greater than or equal to a width of the busbar along the first direction, so that a soldering strength between the busbar and a corresponding conductive wire connecting adjacent solar cells can be improved. For example, when the shape of the cross section of the soldering portion is a rectangle, a length of a long side of the rectangle may be 3 mm, and a length of a broad side of the rectangle may be 2 mm.

In an example, as shown in FIG. 7 and FIG. 8, among all the soldering portions 8 included in the back-contact solar cell, at least a subset of soldering portions 8 located between every two adjacent busbar sections 7 included in the same busbar 5 are first-type soldering portions 9, and the remaining soldering portions 8 are second-type soldering portions 10; among all the fingers 4 included in the positive electrodes 2 and the negative electrodes 3, at least a subset of fingers 4 located at the same height as the first-type soldering portions 9 along the second direction are first-type fingers 11, and the remaining fingers 4 are second-type fingers 12; and each busbar 5 and a soldering portion 8 arranged on the busbar have the same polarity; and each of the first-type fingers 11 includes a plurality of finger sections 13 distributed at intervals along the first direction, and a gap between every two adjacent finger sections 13 included in the same first-type finger 11 is used for separating each of the first-type finger sections from a first-type soldering portion 9 having a polarity opposite to that of the first-type finger sections.

Specifically, quantities of the first-type soldering portions and the second-type soldering portions included in the back-contact solar cell may be set according to an actual requirement, which are not specifically limited herein. For example, as shown in FIG. 7, each soldering portion 8 included in the back-contact solar cell is a first-type soldering portion 9. Alternatively, some soldering portions included in the back-contact solar cell are first-type soldering portions, and the remaining soldering portions are second-type soldering portions. For example, as shown in FIG. 8, columns in which the soldering portions 8 are located are sorted from right to left, in the back-contact solar cell, soldering portions 8 in the first row are first-type soldering portions 9, and soldering portions 8 in other columns are second-type soldering portions 10. Alternatively, in another example, each soldering portion included in the back-contact solar cell is a second-type soldering portion.

In addition, a quantity and lengths of finger sections distributed at intervals along the first direction included in each first-type finger, and a gap between every two adjacent finger sections included in the same first-type finger may be set according to a quantity of first-type soldering portions having a polarity opposite to that of the first-type finger and at least partially located at the same height as the first-type finger along the second direction and an actual requirement, which are not specifically limited herein.

In a case that the foregoing technical solution is used, there is no need to arrange an insulating material between each first-type finger and a soldering portion having a polarity opposite to that of the first-type finger, and short circuit can also be prevented, thereby reducing a use amount of the insulating material and reducing manufacturing costs of the back-contact solar cell.

Figure 9:
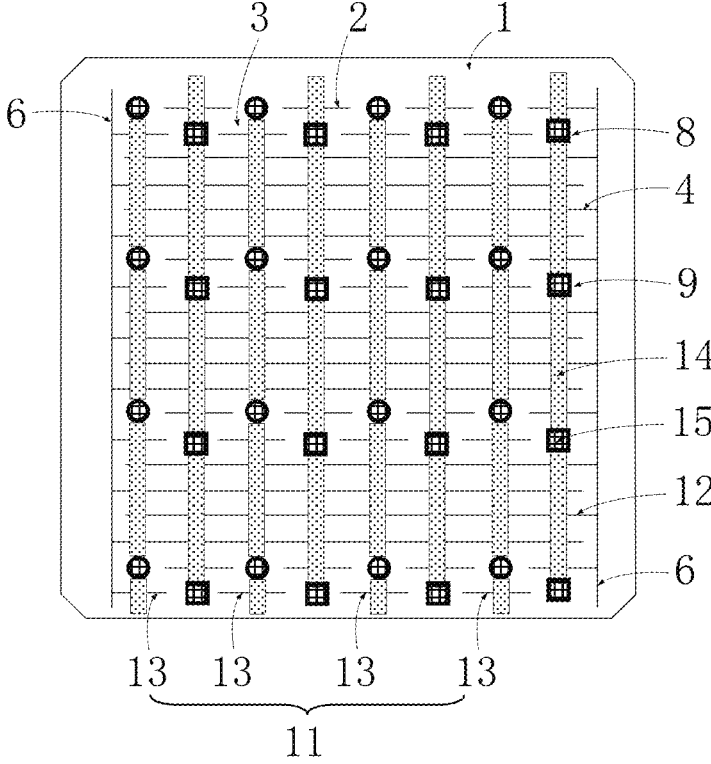
FIG. 9 is a schematic diagram of a solar cell structure according to an embodiment of this application.

According to a second aspect, an embodiment of this application further provides a solar cell structure. As shown in FIG. 9, the solar cell structure includes an insulating material 14 and the back-contact solar cell according to the first aspect and various implementations of the first aspect. The insulating material 14 at least covers a gap between every two adjacent busbar sections included in each busbar.

Specifically, a width of the insulating material may be set according to an actual requirement, which is not specifically limited herein. For example, along the first direction, the width of the insulating material may be greater than a width of each busbar and less than a preset width; and the preset width may range from 1.5 mm to 10 mm. In this case, a width of the insulating material along the first direction has a moderate size, so that an increase in a use amount of the insulating material caused by a large width of the insulating material can be prevented, which is conducive to controlling manufacturing costs of the back-contact solar cell. In addition, a strict requirement on a placement position of a conductive wire connecting adjacent solar cells when different back-contact solar cells are connected together caused by a small width of the insulating material can also be prevented, which is conducive to decreasing the soldering difficulty in connecting at least two back-contact solar cells together.

In a possible implementation, as shown in FIG. 9, in a case that the back-contact solar cell includes soldering portions 8 and each of the soldering portions 8 is connected to a corresponding busbar, the solar cell structure further includes a conductive adhesive 15. The conductive adhesive 15 is arranged on at least one soldering portion 8. In this case, within a specific range, a greater thickness of the insulating material 14 indicates a better insulating effect of the insulating material 14. When the thickness of the insulating material 14 is relatively great, a height of a top of the insulating material 14 may be greater than a height of a top of the soldering portion 8. Based on this, the conductive adhesive 15 is arranged on each soldering portion 8, so that a height of a top of a structure formed by the conductive adhesive 15 and the soldering portion 8 is greater than or equal to the height of the top of the insulating material 14, thereby ensuring that the conductive wire connecting adjacent solar cells can be connected to a corresponding soldering portion 8. It can be learned that, a thickness of the conductive adhesive 15 may be determined according to a difference between the height of the top of the soldering portion 8 and the height of the top of the insulating material 14, which is not specifically limited herein.

According to a third aspect, an embodiment of this application further provides a photovoltaic module. The photovoltaic module includes the back-contact solar cell according to the first aspect and various implementations of the first aspect, or the solar cell structure according to the second aspect and various implementations of the second aspect.

For beneficial effects of the second aspect and various implementations of the second aspect and the third aspect and various implementations of the third aspect in the embodiments of this application, reference may be made to the analysis of the beneficial effects of the first aspect and various implementations of the first aspect, and details are not described herein again.

The foregoing description is merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

Throughout the specification, "one embodiment", "an embodiment", or "one or more embodiments" means that specific features, structures, or characteristics described with reference to the embodiments are included in at least one embodiment of this application. In addition, it should be noted that the wording example "in an embodiment" herein does not necessarily indicate the same embodiment.

Lots of specific details are described in the specification provided herein. However, it can be understood that, the embodiments of this application may be practiced without the specific details. In some examples, well-known methods, structures, and technologies are not shown in detail so as not to obscure the understanding of the specification.

In the claims, any reference sign placed between parentheses shall not be construed as a limitation to the claims. The term "comprise" does not exclude the presence of elements or steps not listed in the claims. The term "a" or "an" preceding an element does not exclude the presence of a plurality of such elements. The use of the terms such as first, second, and third does not indicate any order, and such terms may be interpreted as names.

Finally, it should be noted that the foregoing embodiments are merely used for describing the technical solutions of this application, but are not intended to limit this application. Although this application is described in detail with reference to the foregoing embodiments, it should be appreciated by a person of ordinary skill in the art that, modifications can still be made to the technical solutions recorded in the foregoing embodiments, or equivalent replacements may be made to some technical features; and these modifications or replacements will not cause the essence of corresponding technical solutions to depart from the spirit and scope of the technical solutions in the embodiments of this application.

What is claimed is:

1. A back-contact solar cell, comprising:
a solar cell body; and
a positive electrode and a negative electrode that are on a back surface of the solar cell body, wherein the positive electrode and the negative electrode each comprise:
a plurality of fingers extending along a first direction;
a plurality of busbars extending along a second direction; and
a connection electrode extending along the second direction,
wherein the plurality of fingers of the positive electrode and the plurality of fingers of the negative electrode are spaced apart and alternately arranged along the second direction, wherein at least one finger of the positive electrode is a continuous finger connected to the plurality of busbars of the positive electrode, and at least one finger of the negative electrode is a continuous finger connected to the plurality of busbars of the negative electrode,
wherein the plurality of busbars of the positive electrode and the plurality of busbars of the negative electrode are spaced apart and alternately arranged along the first direction, wherein each busbar is connected to a finger having a same polarity as that of the busbar, each busbar comprises a plurality of busbar sections distributed at intervals along the second direction, wherein each busbar section is separated from a respective finger having a polarity opposite to that of the busbar section by a gap between adjacent busbar sections, and
wherein the plurality of busbars of the positive electrode are located on a same side of the connection electrode of the positive electrode along the first direction, the plurality of busbars of the negative electrode are located on a same side of the connection electrode of the negative electrode along the first direction, and
wherein the connection electrode of the positive electrode and the connection electrode of the negative electrode are each connected to fingers having the same polarity as that of the connection electrode and are insulated from fingers having the polarity opposite to that of the connection electrode.

2. The back-contact solar cell according to claim 1, wherein each continuous finger is connected to one or more busbars having the same polarity as that of the continuous finger.

3. The back-contact solar cell according to claim 1, wherein a continuous finger is not disrupted by gaps.

4. The back-contact solar cell according to claim 1, wherein a length of the gap between two adjacent busbar sections along the second direction ranges from 0.4 mm to 2 mm.

5. The back-contact solar cell according to claim 1, wherein the connection electrode is located at end portions of the plurality of fingers of the positive electrode and the plurality of fingers of the negative electrode, and wherein heads and tails of the plurality of fingers of the positive electrode and the plurality of fingers of the negative electrode are respectively flush with each other.

6. The back-contact solar cell according to claim 1, wherein the plurality of busbars of the positive electrode and the plurality of busbars of the negative electrode are located between the connection electrode of the positive electrode and the connection electrode of the negative electrode.

7. The back-contact solar cell according to claim 1, wherein each finger is spaced from a connection electrode having a polarity opposite to that of the finger by a gap extending along the first direction.

8. The back-contact solar cell according to claim 1, wherein the plurality of busbar sections comprised in a busbar have a same length measured along the second direction and are distributed at equal intervals along the second direction.

9. The back-contact solar cell according to claim 1, wherein busbars having the same polarity each comprise a same quantity of busbar sections numbered in sequence, and
wherein busbar sections corresponding to a same number in busbars having the same polarity are flush with each other along the first direction, and
wherein busbar sections corresponding to a same number in busbars having opposite polarities are staggered along the second direction.

10. The back-contact solar cell according to claim 1, wherein the back-contact solar cell further comprises soldering portions, and each soldering portion is connected to a corresponding busbar having a same polarity as that of the soldering portion.

11. The back-contact solar cell according to claim 10, wherein the soldering portions comprise first-type soldering portions located between adjacent busbar sections of a same busbar,
wherein first-type fingers of the plurality of fingers of the positive electrode are located at a same position along the second direction as the first-type soldering portions, and
wherein each of the first-type fingers comprises a plurality of finger sections distributed at intervals along the first direction, wherein each first-type finger is separated from first-type soldering portions having a polarity opposite to that of the first-type finger by gaps between the finger sections.

12. A photovoltaic module, comprising:
one or more back-contact solar cells, wherein a back-contact solar cell comprises:
a solar cell body; and
a positive electrode and a negative electrode that are on a back surface of the solar cell body, wherein the positive electrode and the negative electrode each comprise;
a plurality of fingers extending along a first direction;
a plurality of busbars extending along a second direction; and
a connection electrode extending along the second direction,
wherein the plurality of fingers of the positive electrode and the plurality of fingers of the negative electrode are spaced apart and alternately arranged along the second direction, wherein at least one finger of the positive electrode is a continuous electrode connected to the plurality of busbars of the positive electrode, and at least one finger of the negative electrode is a continuous finger connected to the plurality of busbars of the negative electrode, wherein the plurality of busbars of the positive electrode and the plurality of busbars of the negative electrode are spaced apart and alternately arranged along the first direction, wherein each busbar is connected to a finger having a same polarity as that of the busbar, each busbar comprises a plurality of busbar sections distributed at intervals along the second direction, wherein each busbar section is separated from a respective finger having a polarity opposite to that of the busbar section by a gap between adjacent busbar sections, and wherein the plurality of busbars of the positive electrode are located on a same side of the connection electrode of the positive electrode along the first direction, the plurality of busbars of the negative electrode are located on a same side of the connection electrode of the negative electrode along the first direction, and wherein the connection electrode of the positive electrode and the connection electrode of the negative electrode are each connected to fingers having the same polarity as that of the connection electrode and are insulated from fingers having the polarity opposite to that of the connection electrode.

13. The back-contact solar cell of claim 1, wherein at least one finger of the positive electrode is a continuous finger intersecting with the plurality of busbars of the positive electrode, and at least one finger of the negative electrode is a continuous finger intersecting with the plurality of busbars of the negative electrode.

14. The photovoltaic module of claim 12, wherein at least one finger of the positive electrode is a continuous finger intersecting with the plurality of busbars of the positive electrode, and at least one finger of the negative electrode is a continuous finger intersecting with the plurality of busbars of the negative electrode.

* * * * *